United States Patent [19]
Kato et al.

[11] 4,163,219
[45] Jul. 31, 1979

[54] REMOTE CONTROL DEVICE FOR ELECTRONIC APPARATUS

[75] Inventors: Takao Kato; Keizo Shimizu; Takeshi Maruyama, all of Yokohama, Japan

[73] Assignee: Hitachi, Ltd., Japan

[21] Appl. No.: 870,677

[22] Filed: Jan. 19, 1978

[30] Foreign Application Priority Data

Feb. 8, 1977 [JP] Japan ................................. 52-12174
Mar. 9, 1977 [JP] Japan ................................. 52-24812

[51] Int. Cl.² ............................................ H04Q 7/00
[52] U.S. Cl. ............................ 340/310 R; 340/310 A
[58] Field of Search ........... 340/147 R, 310 A, 310 R; 307/38, 40

[56] References Cited

U.S. PATENT DOCUMENTS 3,475,619 10/1969 Campbell ................................. 307/40

Primary Examiner—Harold I. Pitts
Attorney, Agent, or Firm—Craig and Antonelli

[57] ABSTRACT

A remote control device applicable to an electronic apparatus provided with a power supply voltage stabilizing unit of switching type for the on-off control of power supplied to the electronic apparatus. The device comprises an electronic switch including a single thyristor or a plurality of transistors controlled by a remote control signal. The circuit operation of at least one of circuits constituting the power supply voltage stabilizing unit is disabled by turning on the electronic switch thereby stopping the power supply to the electronic apparatus, and when the electronic switch is turned off, the circuit operation is restored to restart the power supply to the electronic apparatus.

6 Claims, 7 Drawing Figures

4,163,219

REMOTE CONTROL DEVICE FOR ELECTRONIC APPARATUS

LIST OF PRIOR ART REFERENCES (CFR 1.56(a))

U.S. patent application Ser. No. 769,834
Appln. Date Feb. 17, 1977
Applicant Hitachi, Ltd.

BACKGROUND OF THE INVENTION

This invention relates to a remote control device suitable for application to an electronic apparatus provided with a power supply voltage stabilizing unit of switching type, and more particularly to a remote control device used for switching the power supplied to such an electronic apparatus.

Various kinds of so-called remote control devices have been proposed hitherto so that the on-off control of power to be supplied to an electronic apparatus can be carried out at a location remote from the electronic apparatus. FIG. 1 shows, by way of example, the structure of one of such prior art remote control devices. Referring to FIG. 1, a commercial ac power source 1 is connected through a switch 2 and a relay 3 to a power supply voltage stabilizing circuit 4 which supplies a stabilized power supply voltage to a load circuit 5 in an electronic apparatus. The remote control device includes a relay drive circuit 6, a remote control signal receiver 7 and a remote control signal transmitter 8. After closing the switch 2, a remote control signal which may be an ultrasonic wave signal, an infrared ray signal or any other suitable signal is transmitted from the remote control signal transmitter 8 to the remote control signal receiver 7 which acts to energize or de-energize the relay 3 through the relay drive circuit 6 thereby starting or stopping the operation of the power supply voltage stabilizing circuit 4 connected to the load circuit 5 in the electronic apparatus. Such a prior art system including a relay as above described requires means for continuously supplying an exciting current to the load circuit in the electronic apparatus to maintain the load circuit in its operating state. Namely, it is necessary to continuously supply an exciting current of, for example, about several hundred milliamperes during the operation of the electronic apparatus, and the total power consumed by the electronic apparatus increases by the amount corresponding to the exciting current. Further, the prior art device using the relay is defective in that the reliability of operation is low due to the fact that the flow of large current through the mechanical contacts of the relay accelerates the wear of the contacts resulting in an undesirable reduction in the useful service life of the relay and possibilities of chattering and other troubles.

SUMMARY OF THE INVENTION

It is therefore a primary object of the present invention to provide a novel and improved remote control device which obviates prior art defects as pointed out above and can reliably carry out switching of the power supplied to an electronic apparatus and can also effectively reduce the total power consumed by the electronic apparatus.

According to the present invention there is provided a remote control device for the on-off control of power supply comprising:
 a power supply voltage stabilizing circuit including a
  first rectifying circuit rectifying an ac voltage supplied from an ac power source to provide a non-stabilized dc voltage, a switching circuit chopping said dc voltage, an oscillating circuit generating a pulse signal for driving said switching circuit, a second rectifying circuit rectifying and smoothing said chopped dc voltage again to provide a dc output voltage, and a control circuit detecting a fluctuating component in said dc output voltage and controlling said switching circuit so as to remove said fluctuating component; a load circuit supplied with said dc output voltage of said second rectifying circuit; and at least one electronic switch means actuated in response to the application of a remote control signal, said at least one electronic switch means being connected with at least one of said switching circuit, said second rectifying circuit, said oscillating circuit and said control circuit for disabling the circuit operation of said circuit.

BRIEF DESCRIPTION OF THE DRAWINGS

The invention will now be further described by way of example with reference to the accompanying drawings, in which.

DESCRIPTION OF THE PREFERRED EMBODIMENT

Figure 1:
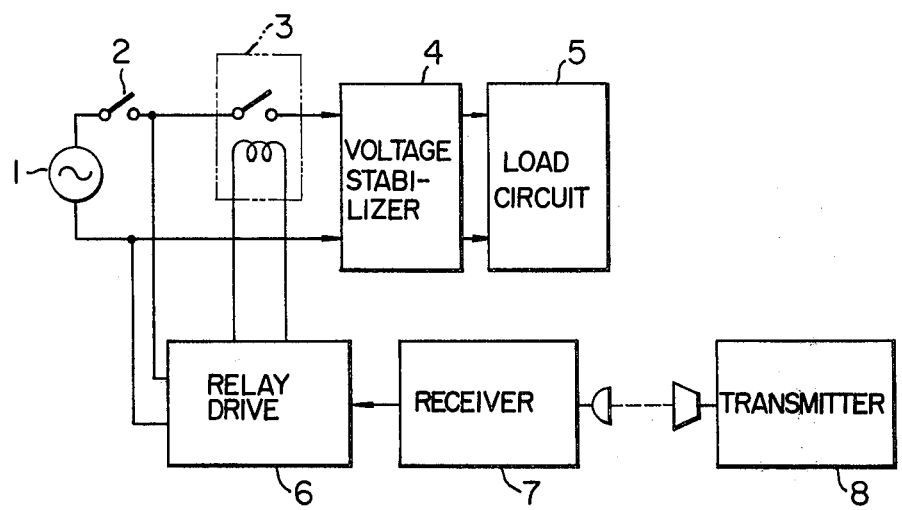
FIG. 1 is a schematic block diagram showing the structure of a prior art remote control device used for the on-off control of power supplied to an electronic apparatus.
Figure 2:
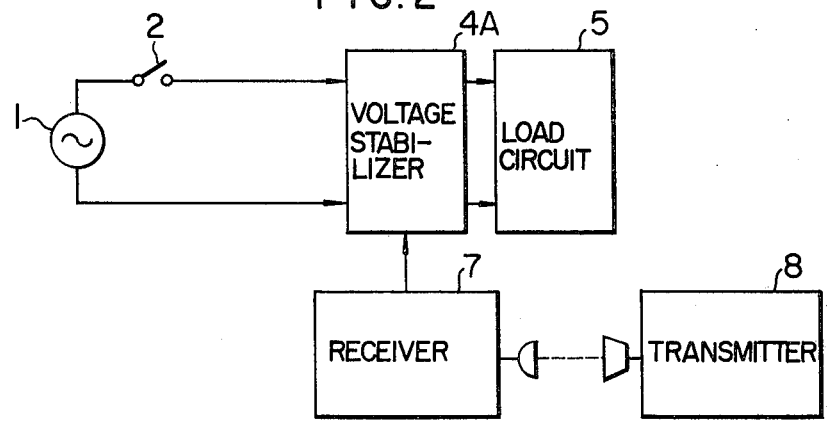
FIG. 2 is a schematic block diagram showing the structure of an embodiment of the remote control device according to the present invention.

An embodiment of the remote control device of the present invention shown in FIG. 2 is generally similar to the prior art device shown in FIG. 1 except that a power supply voltage stabilizing circuit 4A of switching control type is directly controlled by the remote control signal receiver 7 and that the relay 3 and the relay drive circuit 6 are eliminated. Therefore, the same reference numerals are used in FIG. 2 to denote the same parts appearing in FIG. 1.

Figure 3:
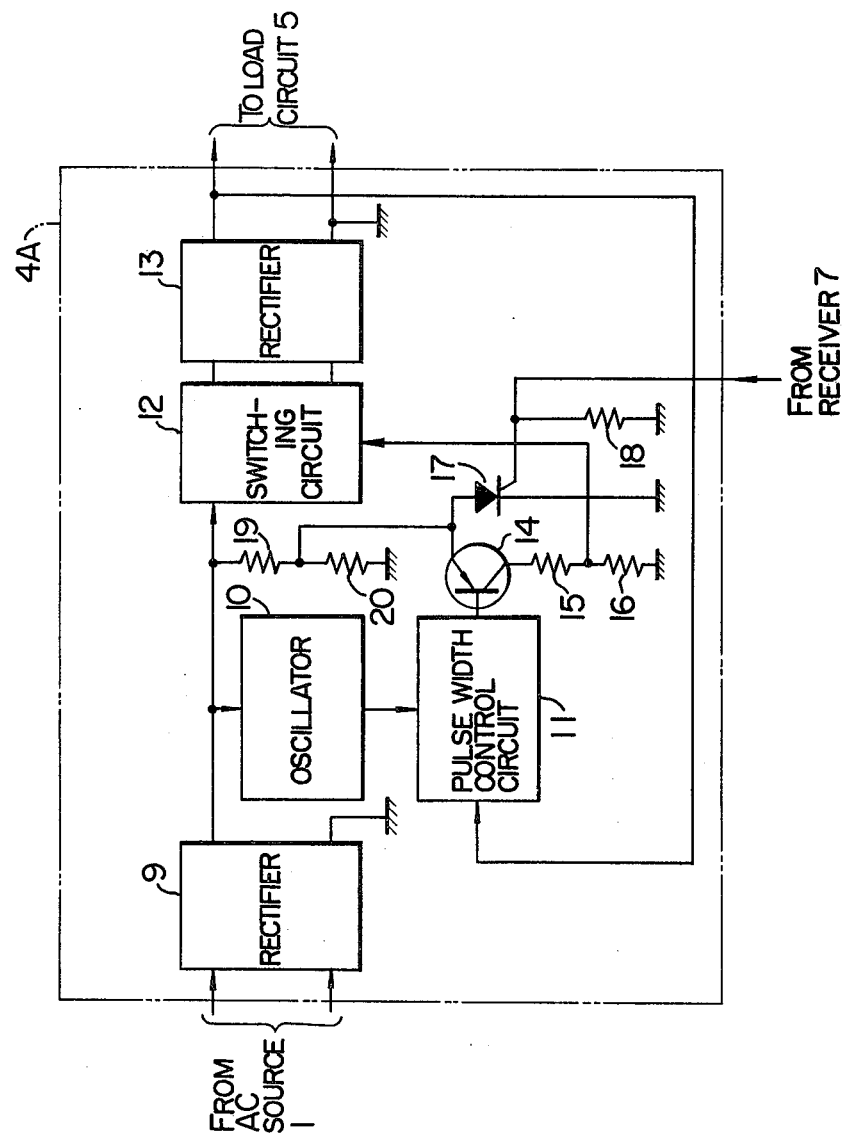
FIG. 3 is a block circuit diagram showing the detailed structure of the power supply voltage stabilizing circuit 4A in FIG. 2.

FIG. 3 shows the detailed structure of the power supply voltage stabilizing circuit 4A in the embodiment shown in FIG. 2. Referring to FIG. 3, the power supply voltage stabilizing circuit 4A includes a first rectifying and smoothing circuit 9, an oscillating circuit 10, a pulse width control circuit 11, a voltage-stabilizing switching circuit 12, a second rectifying and smoothing circuit 13, a drive transistor 14 included in the pulse width control circuit 11, and a plurality of resistors 15, 16, 19 and 20.

The ac voltage supplied from the commercial ac power source 1 is rectified and smoothed into a dc voltage by the first rectifying and smoothing circuit 9. This dc voltage is not fully stabilized yet. The dc voltage output of the first rectifying and smoothing circuit 9 is shaped into a voltage of rectangular waveform by the voltage-stabilizing switching circuit 12, and this voltage of rectangular waveform is rectified and smoothed by the second rectifying and smoothing circuit 13 again to obtain the dc voltage of desired level. A pulse signal generated by the oscillating circuit 10 is passed through the pulse width control circuit 11 to be applied as a rectangular waveform to the base of the drive transistor 14. The transistor 14 repeats its switching operation, and the output of rectangular waveform appearing at the collector of the transistor 14 is divided by the resistors 15 and 16 to provide a control input to the switching circuit 12. The resistors 19 and 20 constitute a voltage divider which applies a suitable voltage to the emitter of the drive transistor 14. The output of the second rectifying and smoothing circuit 13 is applied to the pulse width control circuit 11 so that a fluctuating component which may be contained in the dc output voltage can be removed.

The circuit arrangement above described is disclosed in our U.S. patent application Ser. No. 769,834 as a power supply voltage stabilizing circuit of switching control type and described in detail therein. The operation of the disclosed stabilizing circuit will be briefly described. The pulse signal generated by the oscillating circuit 10 is applied through the pulse width control circuit 11 to the base of the transistor 14, so that the transistor 14 repeats its on-off switching operation. The output of the transistor 14 is divided by the resistors 15 and 16, and the divided voltage is applied to a switching transistor (not shown) in the switching circuit 12 to cause the switching operation of the switching transistor. The waveform of the pulse signal output of the switching circuit 12 is based upon that of the pulse signal generated by the oscillating circuit 10, and after being rectified and smoothed by the second rectifying and smoothing circuit 13, applied as a dc power supply voltage to the load circuit 5 in the electronic apparatus which is, for example, a television receiver or an electronic audio unit. When the dc voltage is subjected to fluctuation, for example, when its voltage level exceeds a predetermined level, the pulse width control circuit 11 acts to modify the pulse width of the pulse signal generated by the oscillating circuit 10 so that the pulse width can be narrowed to remove the source of the fluctuation occurred in the dc voltage. Consequently, the operating period of the switching transistor 14 is shortened to narrow the pulse width of the pulses in the output of the switching circuit 12, and the fluctuating component is removed to provide the dc voltage of predetermined level at the output of the second rectifying and smoothing circuit 13. In this manner, a stabilized dc voltage free from any fluctuating component appears at the output of the second rectifying and smoothing circuit 13.

The first embodiment of the present invention comprises additional provision of a thyristor 17 and a resistor 18 in the voltage stabilizing circuit 4A having such a structure. Referring to FIG. 3, the thyristor 17 is connected at its anode with the emitter of the drive transistor 14 which is an element of the pulse width control circuit 11. The thyristor 17 is grounded at its cathode, and the output of the remote control signal receiver 7 is applied to the gate thereof which is grounded through the resistor 18. In the absence of the remote control signal transmitted from the remote control signal transmitter 8 to the remote control signal receiver 7, a positive potential is normally applied to the gate of the thyristor 17 to maintain the thyristor 17 in its conducting state. In such a state, the emitter of the drive transistor 14 is grounded through the thyristor 17, and no drive input is applied to the switching circuit 12. No switching operation is carried out by the power supply voltage stabilizing circuit 4A, and no power supply voltage is supplied to the load circuit 5 in the electronic apparatus.

The load circuit 5 in the electronic apparatus is placed in operation in response to the transmission of the remote control signal from the remote control signal transmitter 8 to the remote control signal receiver 7. The remote control signal input is amplified in the remote control signal receiver 7 to apply a negative potential to the gate of the thyristor 17 thereby turning off the thyristor 17. The pulse width control circuit 11 acts to suitably control the rate between the periods of high and low levels of the pulse signal generated by the oscillating circuit 10 and shaped into the rectangular waveform, and the drive transistor 14 amplifies such a pulse signal of rectangular waveform and applies the resultant output to the switching circuit 12 to drive the same. Thus, the power supply voltage stabilizing circuit 4A supplies the stabilized dc voltage of desired level to the load circuit 5 in the electronic apparatus to operate the same. The operation of the load circuit 5 in the electronic apparatus can be stopped by transmitting the remote control signal from the remote control signal transmitter 8 to the remote control signal receiver 7 again to apply a positive potential to the gate of the thyristor 17 again. To this end, means such as a flip-flop may be included in the output circuit of the remote control signal receiver 7.

According to the first embodiment of the present invention above described, at least one of the internal circuits of the power supply voltage stabilizing circuit 4A having the circuit elements operating with a relatively low output and relatively low power consumption is utilized for the on-off control of the output of the stabilizing circuit 4A, in contrast to the aforementioned prior art device in which a relatively large current of, for example, several hundred milliamperes is used to carry out the on-off control of power supply or to maintain the load circuit in the electronic apparatus in the excited or operating state.

In the embodiment shown in FIG. 3, therefore, the switching transistor 14 which is a circuit element included in the pulse width control circuit 11 is utilized for the above purpose. However, it is apparent that a circuit element included in the oscillating circuit 10 may be utilized for the entirely same purpose, or a circuit element, for example, a transistor included in the switching circuit 12 may also be utilized for the entirely same purpose. In FIG. 3, the thyristor 17 is used to act as a control element by which the input signal to the transistor 14 is applied to the emitter of the transistor 14 or shorted to ground. However, the thyristor 17 making such a control operation may be replaced by any other suitable means, for example, transistors connected to operate as an element similar to an SCR. Further, the ON-OFF control by the elements including the thyristor 17 may be applied to more than the two terminals above described to exhibit the effect entirely similar to that of the aforementioned embodiment of the present invention.

Figure 4:
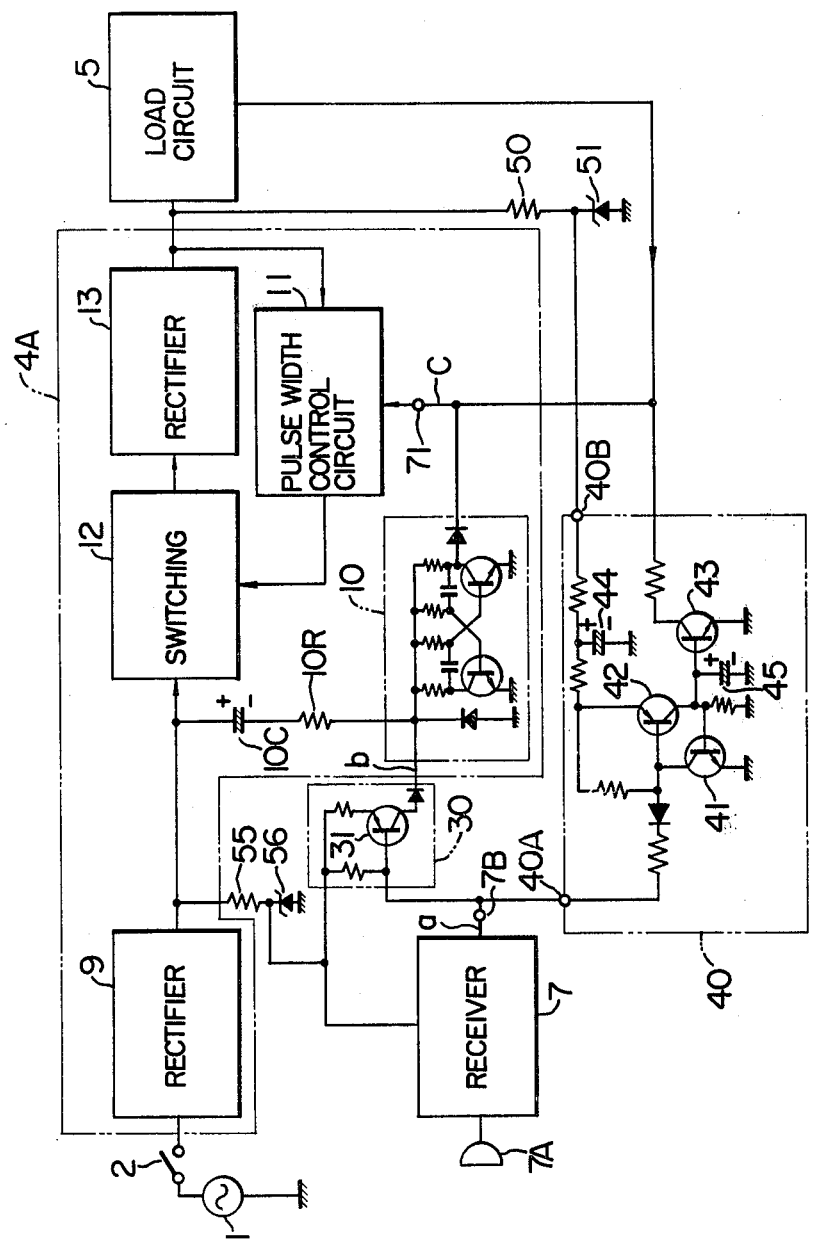
FIG. 4 is a schematic block diagram showing the structure of another embodiment of the remote control device according to the present invention.

FIG. 4 is a circuit diagram of the second embodiment of the present invention, with parts shown by blocks to avoid confusion. In FIG. 4, the same reference numerals are used to denote the same parts and blocks appearing in FIG. 3 showing the first embodiment of the present invention. Therefore, the mode of sequential voltage stabilizing operation carried out by the first rectifying and smoothing circuit 9, oscillating circuit 10, pulse width control circuit 11, switching circuit 12 and second rectifying and smoothing circuit 13 is the same as that described already with reference to the first embodiment. The second embodiment differs from the first embodiment in that two electronic switch circuits, that is, a starting electronic switch 30 and a stopping electronic switch 40 are associated with the remote control signal receiver 7. The starting electronic switch 30 acts to start the operation of the power supply voltage stabilizing circuit 4A thereby supplying the power supply voltage to the load circuit 5 in the electronic apparatus, and the stopping electronic switch 40 acts to stop the supply of the power supply voltage to the load circuit 5 in the electronic apparatus.

When now the switch 2 is closed in the off state of all the circuits in the power supply voltage stabilizing circuit 4A. Alternating current supplied from the ac power source 1 is rectified and smoothed by the first rectifying and smoothing circuit 9 to provide direct current. Consequently, charging current is supplied to a capacitor 10C which constitutes a differentiating circuit together with a resistor 10R, and the voltage differentiated by the combination of the capacitor 10C and the resistor 10R is appllied to the oscillating circuit 10, which includes a known astable multivibrator, to trigger the same, so that the oscillating circuit 10 operates before the electronic switch 30 or 40 is actuated. In response to the operation of the oscillating circuit 10, the power supply voltage stabilizing circuit 4A operates to supply the stabilized voltage to the load circuit 5 in the electronic apparatus in the manner described already with reference to the first embodiment. When the stopping electronic switch 40 is actuated or turned on, in a manner as described in detail later, during the operation of the power supply voltage stabilizing circuit 4A, all the circuits except for the first rectifying and smoothing circuit in the power supply voltage stabilizing circuit 4A cease to operate even when the switch 2 is kept closed.

The on-off of the starting and stopping electronic switches 30 and 40 is controlled by the remote control signal. The starting electronic switch 30 is supplied with operating power from the output of the first rectifying and smoothing circuit 9, while the stopping electronic switch 40 is supplied with operating power from the output of the second rectifying and smoothing circuit 13. The starting electronic switch 30 acts to connect and disconnect the oscillating circuit 10 with and from the first rectifying and smoothing circuit 9, while the stopping electronic switch 40 acts to connect and disconnect ground with and from the pulse signal input terminal 71 of the pulse width control circuit 11. The circuit operation of the pulse width control circuit 11 is disabled when the pulse signal input terminal 71 thereof is connected with ground. The remote control signal is received by a microphone 7A to be supplied from the remote control signal receiver 7 to both of the electronic switches 30 and 40. Resistors 55, 50 and Zener diodes 56, 51 are provided to derive a low voltage from the non-stabilized dc voltage output of the circuit 9 and stabilized dc voltage output of the circuit 13 respectively. However, any other suitable means, for example, voltage dividing resistor means may be provided in lieu of the combinations above described.

Figure 5A:
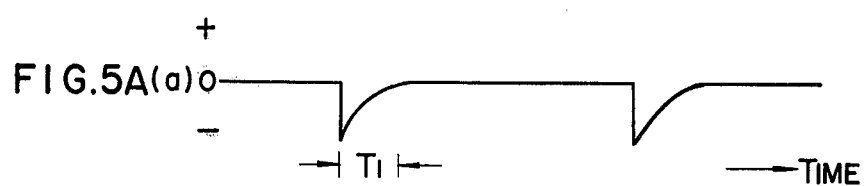
FIGS. 5A, 5B and 5C show waveforms of signals used in the embodiment shown in FIG. 4.
Figure 5B:
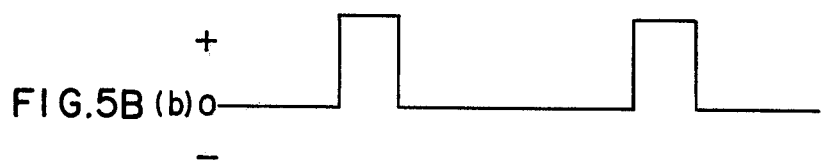

In response to the depression of the actuating button of the remote control signal transmitter 8 in the state in which the switch 2 is kept closed and all the circuits except for the first rectifying and smoothing circuit in the power supply voltage stabilizing circuit 4A are not in operation, the remote control signal which may be the ultrasonic wave signal is transmitted from the transmitter 8 to be received by the microphone 7A of the receiver 7, and a pulse a of negative polarity as shown in FIG. 5A appears at the output terminal 7B of the receiver 7. The receiver 7 is constructed so that such a negative pulse a is generated at the moment the remote control signal, for example, the ultrasonic wave signal ceases to be transmitted to the microphone 7A. In response to the appearance of the negative pulse a shown in FIG. 5A at the output terminal 7B of the receiver 7, a transistor 31 constituting part of the electronic switch 30 is turned on to apply a pulse voltage b as shown in FIG. 5B to the oscillating circuit 10, which starts to operate as soon as such a pulse voltage b is applied thereto.

The power supply voltage stabilizing circuit 4A can sustain its operation when the oscillating circuit 10 starts to operate in response to the application of the pulse voltage b. The reason therefor will now be described. The negative pulse a appearing at the output terminal 7B of the receiver 7 is supplied to the starting electronic switch 30, and at the same time, to an input terminal 40A of the stopping electronic switch 40. Therefore, unless a suitable measure is provided, the stopping electronic switch 40 will also be actuated, and a transistor 43 therein will be turned on to ground the pulse signal input terminal 71 of the pulse width control circuit 11. In such a case, the potential at the input terminal 71 of the pulse width control circuit 11 is reduced to its zero level thereby disabling the circuit operation of the switching circuit 12, and finally, the circuit operation of the voltage stabilizing circuit 4A is also disabled.

To avoid such a trouble, the period of time required for completely charging a capacitor 44 in the stopping electronic switch 40 is selected to be longer than the duration T1 of the negative pulse a applied to the input terminal 40A of the stopping electronic switch 40 so that another transistor 42 in this electronic switch 40 may not be turned on during the above period T1. By virtue of such a measure, the voltage stabilizing circuit 4A starts to operate and sustains its operation when the oscillating circuit 10 starts to operate in response to the application of the negative pulse a in the manner above described.

When the actuating button of the transmitter 8 is manipulated again and the negative pulse a appears at its output terminal 7B in the state in which all the circuits in the voltage stabilizing circuit 4A are in operation, the stopping electronic switch 40 is turned on in response to the application of the negative pulse a to its input terminal 40A, since, in this case, the low voltage provided by the combination of the resistor 50 and the Zener diode 51 is applied to another input terminal 40B of this electronic switch 40. More precisely, transistors 41 and 42 are turned on to turn on the transistor 43 in response to the application of the negative pulse a to the input terminal 40A of the stopping electronic switch 40. As a consequence, the pulse signal input terminal 71 of the pulse width control circuit 11 is grounded, and the pulse width control circuit 11 ceases to generate the pulse signal which controls the switching operation of the switching circuit 12. Therefore, no power is supplied to the second rectifying and smoothing circuit 13 during the period of time in which the input terminal 71 of the pulse width control circuit 11 is grounded. The dc output voltage of the second rectifying and smoothing circuit 13 is reduced, and the load circuit 5 which is, for example, a horizontal deflection circuit of a television receiver ceases to generate its output in the form of a pulse signal. Such a pulse signal may be derived from, for example, a resonance capacitor connected with a primary winding of a flyback transformer. Such a horizontal deflection circuit is described in detail in the aforementioned U.S. patent application.

Even when the stopping electronic switch 40 is turned off again after the generation of the pulse signal from the load circuit 5 has ceased, the load circuit 5 in the electronic apparatus is maintained in its non-operating state since no pulse signal is applied to the pulse signal input terminal 71 of the pulse width control circuit 11. When, on the other hand, the negative pulse a appears at the output terminal 7B of the receiver 7, and the load circuit 5 in the electronic apparatus is in its operating state, the starting electronic switch 30 will be momentarily turned on in response to the appearance of the negative pulse a at the output terminal 7B of the receiver 7. However, the operation of the voltage stabilizing circuit 4A is not affected by the momentary turning-on of the starting electronic switch 30 since the pulse signal input terminal 71 of the pulse width control circuit 11 is now grounded. Capacitors 44 and 45 are provided in the stopping electronic switch 40 so that the transistor 43 can be kept turned on until the load circuit 5 ceases to generate the pulse signal.

It will be understood from the above description of the second embodiment of the present invention that the load circuit 5 in the electronic apparatus can be remotely controlled to be selectively placed in its operating state and its non-operating state without the use of the relay, and the electronic switches 30 and 40 need not be kept turned on during the operating period of the load circuit 5 in the electronic apparatus. Further, a remote control signal of a single kind can sufficiently attain the desired purpose. That is, a single actuating button is merely required for the transmitter 8 and is repeatedly manipulated to attain the desired control so that the voltage stabilizing circuit 4A can be alternately placed in its operating and nonoperating states.

The operation of the remote control device according to the second embodiment of the present invention will now be summarized.

Figure 5C:
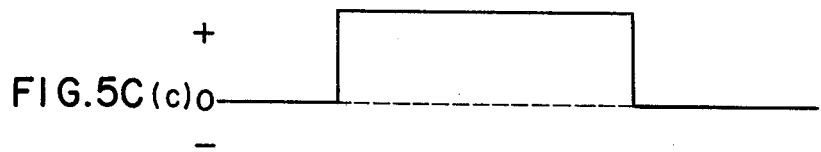

When the actuating button of the transmitter 8 is manipulated in the state in which the switch 2 is turned on and all the circuits except for the first rectifying and smoothing circuit of the power supply voltage stabilizing circuit 4A are not in operation, the ultrasonic wave signal is transmitted from the transmitter 8 to be received by the receiver 7, and the negative pulse signal a shown in FIG. 5A is applied from the receiver 7 to both of the electronic switches 30 and 40. In response to the application of the signal a, the starting electronic switch 30 generates the signal b shown in FIG. 5B so that the oscillating circuit 10 starts to operate and the pulse width control circuit 11 starts to operate also. On the other hand, the negative pulse a applied to the stopping electronic switch 40 is not effective in turning on the transistors 41 and 42 since the capacity of the capacitor 44 is so selected that a period of time longer than the duration T1 of the negative pulse a is required until the capacitor 44 is completely charged by the dc voltage supplied to the input terminal 40B of the switch 40. Consequently, the stopping electronic switch 40 is not turned on by the negative pulse a. Therefore, the input is continuously applied to the pulse signal input terminal 71 of the pulse width control circuit 11 as shown in FIG. 5C.

Then, when the actuating button of the transmitter 8 is manipulated again in the state in which all the circuits of the power supply voltage stabilizing circuit 4A are in operation, the negative pulse signal a is similarly applied to both of the electronic switches 30 and 40. In this case, however, no change occurs in the starting electronic switch 30 in response to the application of the negative pulse a, since this electronic switch 30 has already been actuated. On the other hand, the transistor 43 in the stopping electronic switch 40 is turned on in response to the application of the negative pulse a, and the potential at the pulse signal input terminal 71 of the pulse width control circuit 11 drops down to its zero level thereby finally stopping the operation of the voltage stabilizing circuit 4A.

In the present invention, the transmitter 8 includes only one actuating button as above described. This is advantageous in that the manipulation for the remote control is simplified, and the structure of the receiver 7 can also be simplified. Thus, the receiver 7 may merely include a single amplifying circuit, a single discriminating circuit and a single output circuit.

However, the transmitter 8 may be provided with two actuating buttons, one for the exclusive purpose of starting and the other for the exclusive purpose of stopping. In such a case, the receiver 7 consists of two system each including one discriminating circuit and one output circuit. In the receiver 7 of the above structure, the output of the output circuit in the starting system is connected with the starting electronic switch 30 only, and the output of the output circuit in the stopping system is connected with the stopping electronic switch 40 only.

In the second embodiment of the present invention, the stopping electronic switch 40 has been connected with the input of the pulse width control circuit 11 for the purpose of disabling the circuit operation of the pulse width control circuit 11. However, in a modification, the stopping electronic switch 40 may be connected with the input terminal or output terminal of the switching circuit 12 for the purpose of disabling the operation of the switching transistor in the switching circuit 12. Such a modification can also provide the effect similar to that of the second embodiment. Further, in the same sense, the stopping electronic switch 40 may be connected with the input terminal or output terminal of the second rectifying and smoothing circuit 13 connected with the switching circuit 12 for the purpose of nullifying the input or output of the circuit 13.

What we claim is:

1. A remote control device for the on-off control of power supply comprising:
a power supply voltage stabilizing circuit including a first rectifying circuit rectifying an ac voltage supplied from an ac power source to provide a non-stabilized dc voltage, a switching circuit chopping said dc voltage, an oscillating circuit generating a pulse signal for driving said switching circuit, a second rectifying circuit rectifying and smoothing said chopped dc voltage again to provide a dc output voltage, and a control circuit detecting a fluctuating component in said dc output voltage and controlling said switching circuit so as to remove the fluctuating component;

a load circuit supplied with said dc output voltage of said second rectifying circuit; and at least one electronic switch means actuated in response to the application of a remote control signal, said at least one electronic switch means being connected with at least one of said switching circuit, said second rectifying circuit, said oscillating circuit and said control circuit for disabling the circuit operation of said circuit.

2. A remote control device as claimed in claim 1, wherein said electronic switch means includes a single electronic switch in the form of a thyristor which is connected with the output terminal of at least one of said switching circuit, said second rectifying circuit, said oscillating circuit and said control circuit, whereby, when a pulse of first polarity in said remote control signal is applied to the gate of said thyristor, said thyristor acts to ground the output terminal of said at least one circuit thereby disabling the circuit operation of said at least one circuit, while when a pulse of second polarity in said remote control signal is applied to the gate of said thyristor, said thyristor acts to recover the circuit operation of said at least one circuit.

3. A remote control device as claimed in claim 1, wherein said electronic switch means includes a first electronic switch and a second electronic switch, and said first electronic switch is connected with at least first one of said switching circuit, said second rectifying circuit, said oscillating circuit and said control circuit, while said second electronic switch is connected with at least one of said switching circuit, said second rectifying circuit, said oscillating circuit and said control circuit, whereby said first electronic switch is actuated to start the operation of said power supply voltage stabilizing circuit in response to the reception of said remote control signal, and said second electronic switch is actuated to stop the operation of said power supply voltage stabilizing circuit in response to the reception of said remote control signal.

4. A remote control device as claimed in claim 1, wherein said electronic switch means includes a starting electronic switch and a stopping electronic switch, and said starting electronic switch is connected with said oscillating circuit and is actuated by said remote control signal to start the operation of said oscillating circuit having been kept de-energized, while said stopping electronic switch is connected with said control cicuit, said stopping electronic switch having been kept in the off state being actuated by said remote control signal thereby disabling the circuit operation of said control circuit.

5. A remote control device as claimed in claim 1, wherein said electronic switch means includes a starting electronic switch and a stopping electronic switch, and said starting electronic switch is connected with said oscillating circuit and is actuated by said remote control signal to start the operation of said oscillating circuit having been kept de-energized, while said stopping electronic switch is connected with said control circuit, said stopping electronic switch having been kept in the off state being actuated by said remote control signal thereby disabling the circuit operation of said control circuit, said stopping electronic switch including delay means which prevents circuit elements constituting said stopping electronic switch from being placed in their operable state during at least the period of time in which said remote control signal is applied to the input terminal of said stopping electronic swith to which no circuit power has been supplied.

6. A remote control device as claimed in claim 1, wherein said electronic switch means includes a starting electronic switch and a stopping electronic switch, and said starting electronic switch is connected with said oscillating circuit and is actuated by said remote control signal to start the operation of said oscillating circuit having been kept de-energized, while said stopping electronic switch is connected with said control circuit, said stopping electronic switch having been kept in the off state being actuated by said remote control signal thereby disabling the circuit operation of said control circuit, said stopping electronic switch including delay means which prevents circuit elements including transistors constituting said stopping electronic switch from being placed in their operable state during at least the period of time in which said remote control signal is applied to the input terminal of said stopping electronic switch to which no circuit power has been supplied, said delay means including a capacitor connected with one of said transistors.

* * * * *